US008865513B2

(12) United States Patent
Kim et al.

(10) Patent No.: US 8,865,513 B2
(45) Date of Patent: Oct. 21, 2014

(54) HIGH-DENSITY P-DOPED QUANTUM DOT SOLAR CELL OBTAINED BY THE ACTIVE DOPING OF INP AND A PRODUCTION METHOD THEREFOR

(75) Inventors: Kyung Joong Kim, Daejeon (KR); Seung Hui Hong, Seoul (KR); Jae Hee Park, Gyeonggi-do (KR); Woo Lee, Daejeon (KR)

(73) Assignee: Korea Research Institute of Standards and Science (KR)

( * ) Notice: Subject to any disclaimer, the term of this patent is extended or adjusted under 35 U.S.C. 154(b) by 71 days.

(21) Appl. No.: 13/806,313

(22) PCT Filed: Jul. 2, 2010

(86) PCT No.: PCT/KR2010/004307
§ 371 (c)(1),
(2), (4) Date: Jan. 16, 2013

(87) PCT Pub. No.: WO2011/162433
PCT Pub. Date: Dec. 29, 2011

(65) Prior Publication Data
US 2013/0122640 A1    May 16, 2013

(30) Foreign Application Priority Data
Jun. 25, 2010   (KR) ........................ 10-2010-0060404

(51) Int. Cl.
*H01L 21/00*      (2006.01)
*H01L 31/18*      (2006.01)
*H01L 31/0304*    (2006.01)
*H01L 31/0352*    (2006.01)
*H01L 31/06*      (2012.01)

(52) U.S. Cl.
CPC .......... *H01L 31/1864* (2013.01); *Y02E 10/544* (2013.01); *H01L 31/03042* (2013.01); *H01L 31/035218* (2013.01); *H01L 31/06* (2013.01); *H01L 31/184* (2013.01)
USPC .......... 438/94; 438/93; 438/289; 257/E21.14; 257/E31.003

(58) Field of Classification Search
USPC .............. 438/93, 94, 289, 522, 526; 257/403, 257/E31.003, E21.14; 977/700–774
See application file for complete search history.

(56) References Cited

U.S. PATENT DOCUMENTS 4,500,367 A  *  2/1985  Keramidas et al. ............. 117/61
6,372,582 B1 *  4/2002  Rouse et al. .................. 438/289

(Continued)

FOREIGN PATENT DOCUMENTS

| KR | 1020090103114 | 10/2009 |
| KR | 1020100019722 | 2/2010 |

OTHER PUBLICATIONS

Thermal desorption of oxides on InP Lau, W.M.; Sodhi, R.N.S. (Surface Sci. Western, University of Western Ontario, London, Ont., Canada); Ingrey, S. Applied Physics Letters (Feb. 1, 1988), vol. 52, No. 5, p. 386-8, 9 refs. (Received Sep. 16, 1987; accepted for publication Nov. 24, 1987).*
International Search Report—PCT/KR2010/004307 dated Jul. 26, 2011.

(Continued)

*Primary Examiner* — Mohsen Ahmadi
*Assistant Examiner* — Abdulfattah Mustapha
(74) *Attorney, Agent, or Firm* — Cantor Colburn LLP

(57) ABSTRACT

Provided is a manufacturing method of a semiconductor quantum dot-sensitized solar cell. More particularly, the manufacturing method according to the present invention includes: a quantum dot forming step of forming a semiconductor layer containing a group 4 element and InP on a substrate and then performing heat-treatment on the substrate including the semiconductor layer formed thereon to remove indium (In) therefrom, thereby forming an n-type semiconductor quantum dot, which is a group 4 element quantum dot doped with phosphorus (P).

11 Claims, 7 Drawing Sheets

(56) References Cited

U.S. PATENT DOCUMENTS

2007/0089784 A1* 4/2007 Noh et al. .................... 136/263
2010/0224861 A1* 9/2010 Jain et al. ....................... 257/20
2011/0146766 A1* 6/2011 Nozik et al. .................. 136/255

OTHER PUBLICATIONS

Park, et al., n-Type silicon quantum dots and p-type crystalline silicon heteroface solar cells, Solar Energy Materials & Solar Cells, 2009, pp. 684-690.

* cited by examiner

FIG. 4
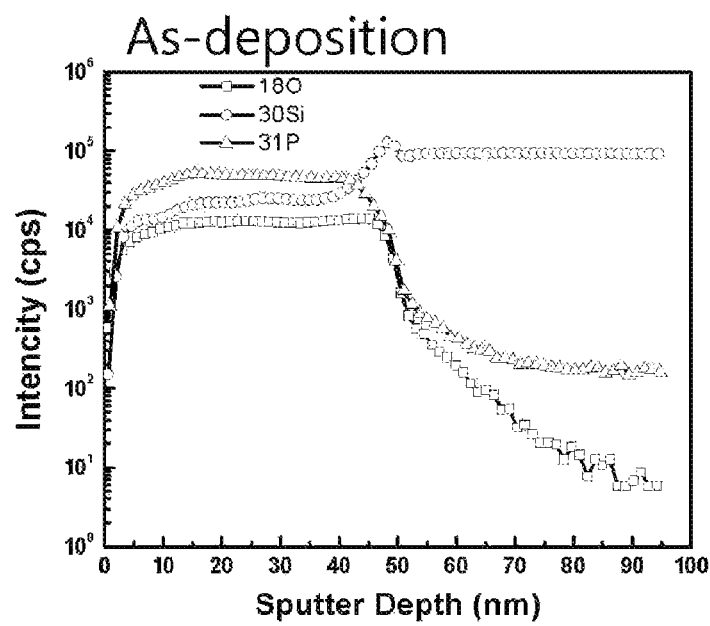
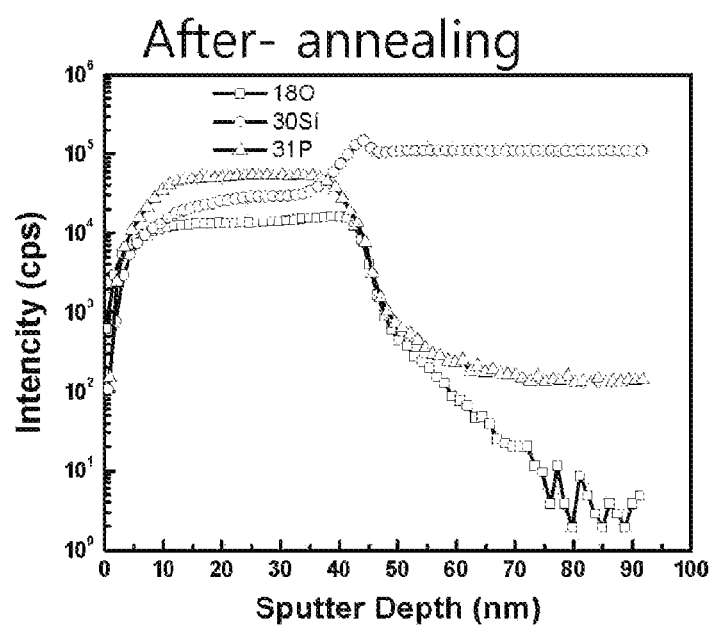

FIG. 5
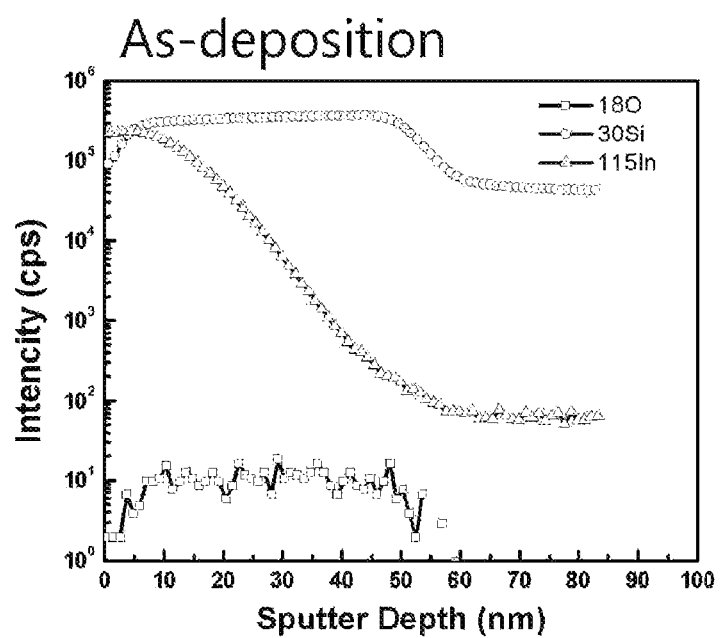
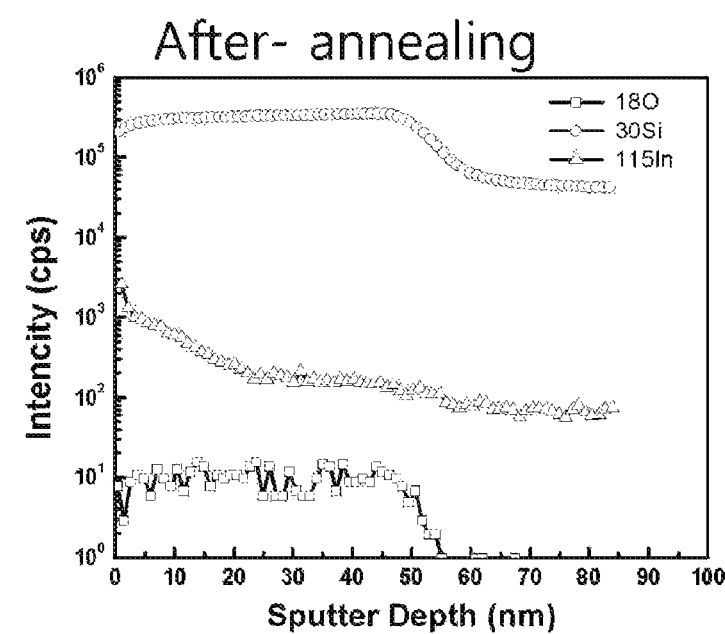

HIGH-DENSITY P-DOPED QUANTUM DOT SOLAR CELL OBTAINED BY THE ACTIVE DOPING OF INP AND A PRODUCTION METHOD THEREFOR

TECHNICAL FIELD

The present invention relates to a quantum dot solar cell and a manufacturing method thereof, and more particularly, to a solar cell in which a having high-concentration P-doped semiconductor quantum dot, and a manufacturing method thereof.

BACKGROUND ART

In the case of a photovoltaic device, in order to reduce manufacturing cost and improve efficiency, research into a technology of using various materials except for silicon has been conducted. However, due to characteristics of photovoltaic device using principles of semiconductors, a photovoltaic device made of other materials has low efficiency and a short lifespan due to degradation as compared to a photovoltaic device based on silicon, such that actual market share of the photovoltaic device made of other materials is only about 3%.

In the case of the photovoltaic device based on silicon, single crystalline silicon or polycrystalline silicon is mainly used, and cost of silicon material and wafer is more than 40% of the total construction cost at the time of construction of a photovoltaic system. Therefore, as a realistic solution, efforts to reduce an amount of silicon required to produce unit power by increasing photovoltaic efficiency using a silicon quantum dot and minimize consumption of silicon using a thin-film device have been made.

In manufacturing of the silicon quantum dot solar cell and silicon thin film solar cell as described above, growth of a silicon thin film doped with a semiconductor element is very important for improving performance of the solar cell. In the case of using the existing thermal diffusion method and chemical vapor deposition method, there is a limitation in adjusting a doping concentration, such that a special method for high density doping has been required.

DISCLOSURE

Technical Problem

An object of the present invention is to provide a manufacturing method of an n-type semiconductor quantum dot solar cell doped with high-concentration n-type impurity using a compound target, and particularly to provide a manufacturing method capable of reproducibly doping an impurity element and simply and easily manufacturing an n-type semiconductor quantum dot solar cell having high efficiency.

Technical Solution

In one general aspect, a manufacturing method of a semiconductor quantum dot solar cell, the manufacturing method of a quantum dot solar cell includes: a quantum dot forming step of forming a semiconductor layer containing a group 4 element and InP on a substrate and then removing the indium (In) atoms from the semiconductor layer by post heat-treatment on the substrate, thereby forming an n-type semiconductor quantum dot, which is a group 4 element quantum dot doped with phosphorus (P).

At the time of heat-treatment, removal of In may be performed by evaporation (evaporation from a solid phase to a gas phase).

The semiconductor layer may be made of a group 4 element or a compound of group 4 element with physically doped InP.

The semiconductor layer may include an amorphous phase doped with InP, wherein the amorphous phase doped with InP includes an amorphous phase of a group 4 element doped with InP, an amorphous phase of group 4 element oxides doped with InP, an amorphous phase of group 4 element nitrides doped with InP, or a mixture thereof.

The semiconductor layer may be a thin film of a group 4 element doped with InP, a nitride thin film of group 4 element doped with InP, an oxide thin film of group 4 element doped with InP, or a stacked multiple layer film thereof.

The semiconductor layer containing the group 4 element and InP may be formed by a physical deposition method. Particularly, the physical deposition method may be a sputtering method, and the sputtering method may be performed by by simultaneous sputtering of a group 4 element target and a InP target with ion beams.

The group 4 element may be at least one element selected from Si and Ge, and the heat treatment is performed at 900 to 1150° C. in the quantum dot forming step.

Preferably, the manufacturing method according to the present invention includes: a) a step of alternately stacking a matrix layer and the semiconductor layer on a p-type semiconductor substrate to form a composite stacked multiple layer; b) a step of performing heat-treatment on the composite stacked multiple layer to form semiconductor quantum dots doped with phosphorus (P) in a matrix, which is semiconductor nitrides, semiconductor oxides, or a mixture thereof; and c) a step of performing heat-treatment under hydrogen atmosphere to bond non-bonded electrons of the semiconductor quantum dots doped with P to hydrogen.

The semiconductor layer may be a thin film of a group 4 element doped with InP, a nitride thin film of group 4 element doped with InP, an oxide thin film of group element doped with InP, or a stacked multiple layer thereof, and the matrix layer is a nitride of group 4 element, an oxide of group 4 element, or a mixture thereof, independently of the semiconductor layer.

Thicknesses of the matrix layer and the semiconductor layer are 0.5 to 5 nm, independently.

The manufacturing method according to the present invention may further include, after the quantum dot forming step, an electrode forming step of forming two electrodes facing each other and having the substrate and the n-type semiconductor quantum dots therebetween, wherein at least one electrode is a transparent electrode. In addition, a polycrystalline semiconductor layer, which is a semiconductor layer of polycrystalline group 4 element doped with a group 3 or 5 element, may be further formed between the n-type semiconductor quantum dot and the transparent electrode.

Advantageous Effects

In the manufacturing method of a quantum dot solar cell according to the present invention, since the InP compound is used as the n-type impurity for manufacturing the n-type semiconductor quantum dot, a doping concentration of P may be adjusted by physically forced injection, the n-type semiconductor quantum dot doped with P at a significantly high concentration may be manufactured, and In may be completely removed by the heat-treatment, such that high purity P doping may be performed.

In addition, n-type semiconductor quantum dots having various sizes may be embedded in an n-type region configuring a p-n junction, and a compound target that is stable at room temperature is used for n-type doping, such that the impurity element may be reproducibly doped under relaxed process conditions. Further, the solar cell including the n-type semiconductor quantum dots doped with the impurity at a significantly high concentration may be manufactured by the significantly simple and easy method, that is, by sputtering and heat treatment, and the solar cell having excellent light absorption efficiency may be manufactured.

DESCRIPTION OF DRAWINGS

FIG. 4 shows results obtained by secondary ion mass spectrometry (SIMS) sputter depth profiling of O, Si, and P, before and after annealing of a semiconductor layer;

FIG. 5 shows results obtained by secondary ion mass spectrometry (SIMS) sputter depth profiling of O, Si, and In, before and after annealing of a semiconductor layer;

DETAILED DESCRIPTION OF MAIN ELEMENTS

Figure 1:
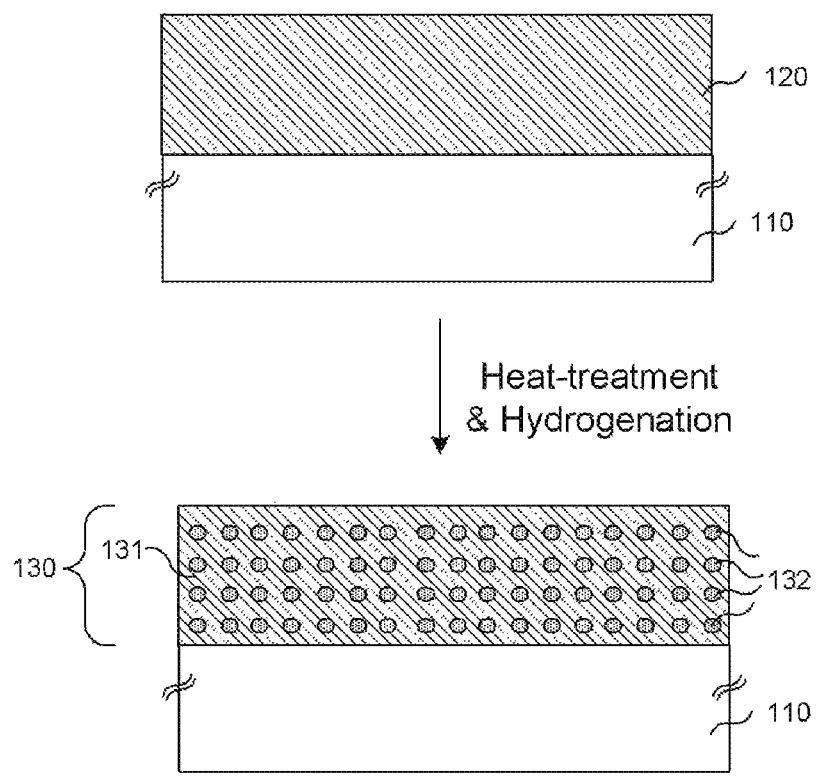
FIG. 1 is a process flow chart showing a manufacturing method of a quantum dot solar cell according to the present invention.

110: substrate
120: composite stacked multiple layer, 121: matrix layer, 122, 123: semiconductor layer,
130: quantum dot layer, 131: matrix, 132: quantum dot layer,
133: group 4 element layer, 134: surface oxide layer
210: transparent conducting film, 310, 320: electrode

BEST MODE

Hereinafter, a manufacturing method according to the present invention will be described in detail with reference to the accompanying drawings. The drawings to be provided below are provided by way of example so that the idea of the present invention can be sufficiently transported to those skilled in the art. Therefore, the present invention is not limited to the drawings to be provided below, but may be modified in many different forms. In addition, the drawings to be provided below may be exaggerated in order to clarify the scope of the present invention. Further, like reference numerals denote like elements throughout the specification.

Here, technical terms and scientific terms used in the present specification have the general meaning understood by those skilled in the art to which the present invention pertains unless otherwise defined, and a description for the known function and configuration obscuring the present invention will be omitted in the following description and the accompanying drawings.

FIG. 1 is an example of a process flow chart showing a step of forming a quantum dot in a manufacturing method according to the present invention. As shown in FIG. 1, a semiconductor layer 120 containing InP and group 4 elements is formed on a substrate 110, and then the substrate 110 having the semiconductor layer 120 formed thereon is heat-treated and hydrogenated, such that a semiconductor quantum dot layer 130 in which n-type semiconductor quantum dots 132, which are P-doped quantum dots of group 4 element, are embedded in a matrix 131 containing the group 4 element is manufactured.

In more detail, the semiconductor layer 120 may be a film in which InP is actively doped as impurity on group 4 elements, oxides of group 4 element, nitrides of group 4 element, a mixture thereof, or a stacked thin film thereof, wherein the group 4 element, the oxides of group 4 element, the nitrides of group 4 element, or the mixture thereof that is contained in the semiconductor layer 120 may have an amorphous phase, and In in InP contained in the semiconductor layer is selectively evaporated (evaporation from a solid phase to a gas phase) and removed by the heat-treatment of the semiconductor layer 120, thereby forming the n-type quantum dot 132.

In detail, at the time of heat-treatment of the semiconductor layer 120, which is the InP actively doped film, only In is selectively evaporated and removed from the semiconductor layer 120 by a difference in vapor pressure, and the n-type semiconductor quantum dots 132, which are group 4 element quantum dots purely doped with P, are formed.

Since InP is a stable compound at room temperature, the semiconductor layer 120, which is a film actively doped with InP as the impurity by a physical deposition method using InP and group 4 element targets, may be manufactured, and the semiconductor layer 120 may be doped with InP at a high concentration and a precisely controlled concentration.

Specifically, the physical deposition is performed on the semiconductor layer 120, wherein the physical deposition is sputtering. More particularly, the sputtering for forming the semiconductor layer 120 is performed by a method of simultaneously sputtering thin-type InP and group 4 element targets to deposit the target.

In this case, a concentration of InP contained in the semiconductor layer 120 formed on the substrate 110 may be controlled by a relative sputtering area of the InP and group 4 element targets used at the time of sputtering or intensity of ion beams.

In detail, the group 4 element may be Si, Ge, or a SiGe compound, and the substrate may be a p-type semiconductor substrate. Here, the p-type semiconductor substrate may be preferably a substrate in which the same element as the group 4 element contained in the semiconductor layer 120 is doped with p-type impurity.

Preferably, the semiconductor layer 120 may be a thin film of a group 4 element in which oxide of the group 4 element, nitride of the group 4 element, a mixture thereof, or a stacked thin film thereof are actively doped with InP as the impurity. Therefore, the semiconductor quantum dot layer 130 manufactured by the heat-treatment may have a structure in which a plurality of n-type semiconductor quantum dots 132 are embedded in the matrix 131, which is the oxide of group 4 element, the nitride of group 4 element, the mixture thereof in an array.

Figure 2:
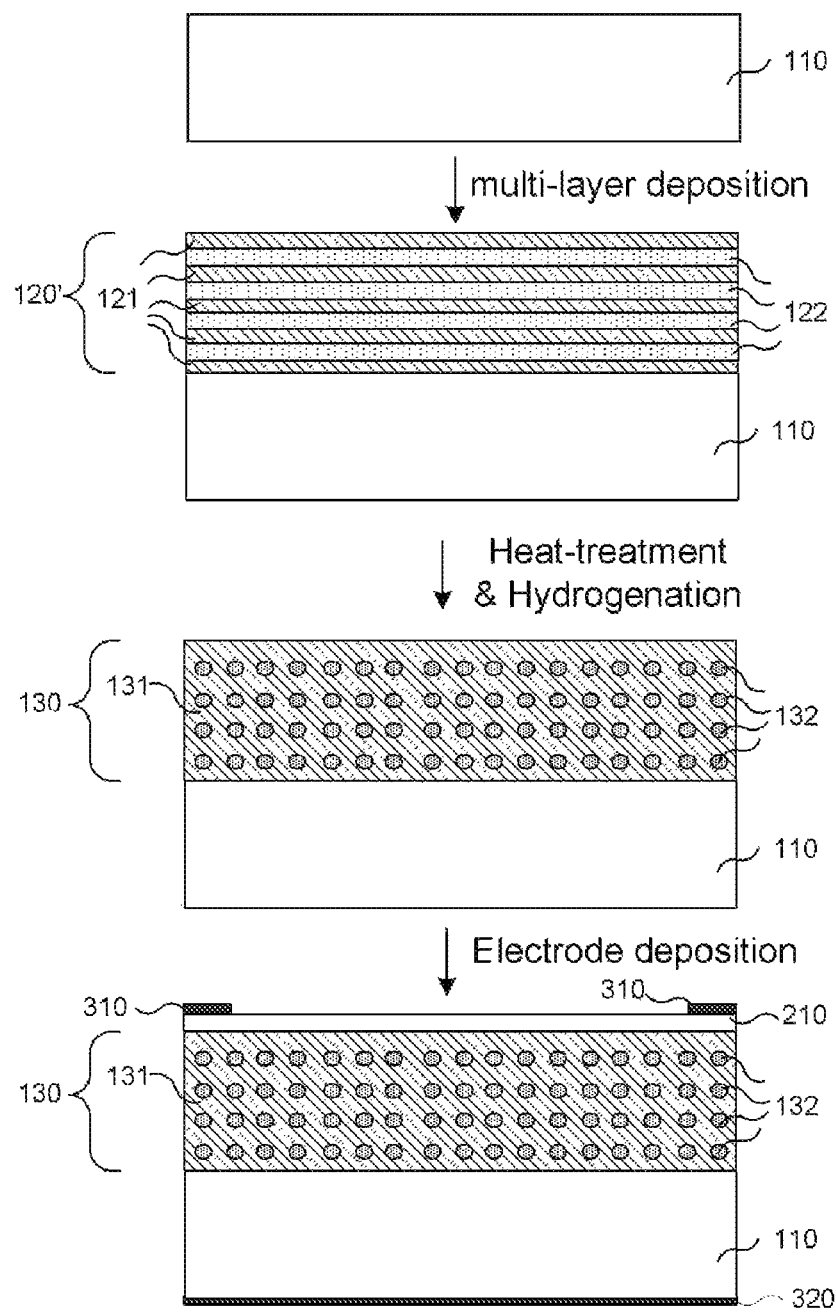
FIG. 2 is another process flow chart showing a manufacturing method of a quantum dot solar cell according to the present invention.

FIG. 2 is a preferable process flow chart showing a manufacturing method according to the present invention. Referring to FIG. 2, a composite stacked multiple layer 120' having a multi-layer thin film structure is manufactured by alternately depositing the matrix layer 121 and the semiconductor layer 122 described with reference to FIG. 1 using the deposit process on the substrate 110, preferably, on the p-type semiconductor substrate. Here, in order to smoothly perform the next deposition of a transparent conducting film, a pure group 4 element layer 123 is deposited on a surface, and an oxide layer 124 of group 4 element is deposited thereon.

The matrix layer 121 may be made of the oxide of the group 4 element, the nitrite of the group 4 element, or the mixture thereof, and a plurality of matrix layer 121 configuring the composite stacked multiple layer 120' may be made of different material in each film (semiconductor oxides, semiconductor nitrites, a mixture thereof) and have different thickness from each other.

Preferably, in the case in which the group 4 element of the semiconductor layer 122 is an oxide phase, the matrix layer 121 may also be the oxide phase, and in the case in which the group 4 element of the semiconductor layer 122 is a nitrite phase, the matrix layer 121 may be also be nitrite phase.

Since the n-type semiconductor quantum dot 132, which is group 4 element quantum dot doped with P is formed by the heat-treatment of the semiconductor layer 122, a position, a size, and the number of n-type semiconductor quantum dots 132, or the like, in the matrix 131 is controlled by a thickness of the semiconductor layer 122, a composition of the semiconductor layer 122, the number of semiconductor layer 122 configuring the composite stacked multiple layer 120', or the like.

More specifically, at the time of deposition of the composite stacked multiple layer 120', the matrix layer 121 and the semiconductor layer 122 may be deposited so as to have thicknesses of 0.5 to 5 nm, respectively.

In addition, the composite stacked multiple layer 120' is manufactured so as to have several to several hundred nm, such that a thickness of the semiconductor quantum dot layer 130 manufactured by heat-treatment of the composite stacked multiple layer 120' is controlled to have a thickness of several to several hundred nm.

Next, similarly to the case described with reference to FIG. 1, the composite stacked multiple layer 120' is heat-treated, thereby forming the semiconductor quantum dot layer 130 in which a plurality of n-type semiconductor quantum dots 132 are formed in the matrix 131 and polycrystalline group 4 element layer 133 is formed on a surface.

In is selectively removed by the heat-treatment, and an n-type semiconductor quantum dot 132 array enclosed by the matrix is formed by relaxing stress relaxation and minimizing interface energy. After the n-type semiconductor quantum dot 132 array is formed, heat-treatment is performed again under hydrogen atmosphere to bond nonbonding electrons of the n-type semiconductor quantum dot 132 to hydrogen.

In the heat-treatment for forming the n-type semiconductor quantum dot 132, selective evaporation and removal of In, a material of the matrix, a material of the semiconductor layer, a size and density of the quantum dot to be manufactured should be considered, and particularly, main consideration factors are selective removal of In and formation of the n-type semiconductor quantum dot having quantum confinement effect. To this end, the heat-treatment for forming the n-type semiconductor quantum dot 132 may be preferably performed at 900 to 1150° C.

In the case in which the heat-treatment temperature is excessively low at the time of manufacturing the n-type semiconductor quantum dot, In is not removed and movement of materials is difficult, such that it may be difficult to obtain a shape of the semiconductor quantum dot, and in the case in which the heat-treatment temperature is excessively high, P as well as In may be removed, the size of the semiconductor quantum dot may be significantly non-uniform, and a granulated particle having weak quantum confinement effect may be formed.

In more detail, the heat-treatment for forming the n-type semiconductor quantum dot 132 may be performed at 1100 to 1150° C. in the case in which the matrix is the oxide of group 4 element, preferably, silicon oxide ($SiO_2$) and performed at 900 to 1100° C. in the case in which the matrix is semiconductor nitride, preferably silicon nitride ($Si_3N_4$), and the heat-treatment may be performed preferably for 10 to 30 minutes.

Then, a hydrogenation step of performing the heat-treatment under hydrogen atmosphere to bond non-bonding electrons of the n-type semiconductor quantum dot to hydrogen is performed. The heat-treatment temperature in the hydrogenation step needs to be determined according to the kind of semiconductor quantum dot. In the case in which the semiconductor quantum dot is a silicon quantum dot, the heat-treatment may be preferably performed at 600 to 700° C. for 30 to 90 minutes under hydrogen atmosphere using forming gas (95% Ar, 5% $H_2$).

Next, as shown in FIG. 2, the transparent conducting film 210 is formed on the heat-treated semiconductor layer 130, and a step of forming electrodes 310 and 320 at an upper portion of the transparent conducting film 210 and a lower portion of the substrate may be performed. The electrodes 310 and 320 may be manufactured by a general printing method such as a screen printing method using a conductive metal paste, a stencil printing method, or the like, or a deposition method such as physical/chemical vapor deposition method (PVD/CVD).

Figure 3:
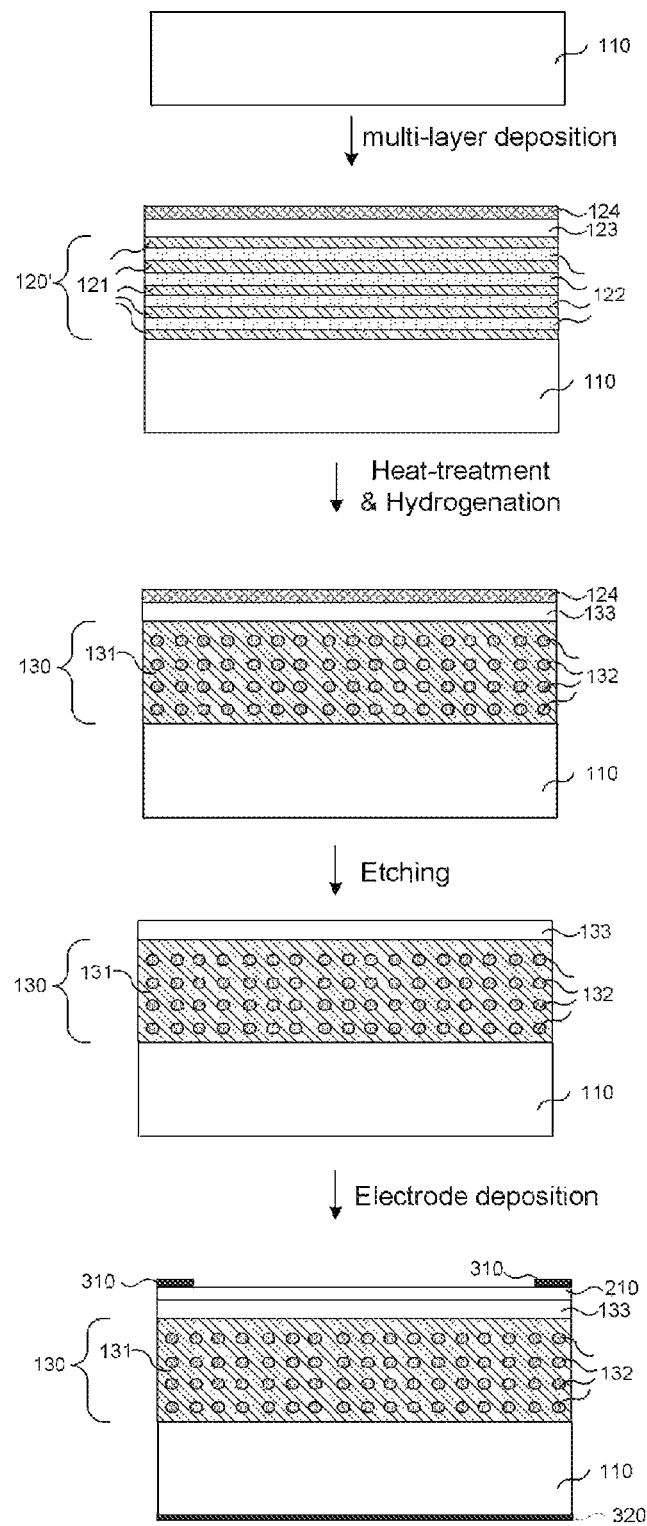
FIG. 3 is still another process flow chart showing a manufacturing method of a quantum dot solar cell according to the present invention.

FIG. 3 is a preferable process flow chart showing a manufacturing method according to the present invention. As shown in FIG. 3, in the manufacturing method according to the present invention, it may be preferable that after the composite stacked multiple layer 120' is formed, the group 4 element layer 123 is further formed on the composite stacked multiple layer 120', and a surface oxide layer 124, which is an oxide layer of group 4 element, is further formed on the group 4 element layer 123.

The group 4 element layer 123 may be a thin film in which a matrix of pure group 4 element that is not oxidized or nitrided is doped with group 3 or 5 element as impurity, and more particularly, a thin film of group 4 element having an amorphous form or polycrystalline form. For example, the group 4 element layer may be a polycrystalline silicon layer. Here, in the case in which the substrate 110 is a p-type substrate, the group 4 element layer 123 may be preferably doped with n-type impurity.

The group 4 element layer 123 serves to smoothly move a flow of electrons and positive holes that are formed in the quantum dots 132 to the electrode and facilitate deposition of the transparent conducting film 210. For a smooth flow of photo-charges and prevention of annihilation due to recombination of photo-charges, the group 4 element layer 123 may have a thickness of 30 to 50 nm.

The surface oxide layer 124 may be a complete oxide phase of group 4 element bonded to a stoichiometric amount of oxygen and serve to protect a photo active region and a photo-charge moving region of the solar cell at the time of heat-treatment. Since the surface oxide layer 124 needs to be removed after the heat-treatment, the surface oxide layer 124 may have a thickness of 20 nm or more, and substantially, have a thickness of 20 to 50 nm.

Then, similarly to the case described with reference to FIG. 2, after the composite stacked multiple layer 120' in which the group 4 element layer 123 and the surface oxide layer 124 are formed is heat-treated and hydrogenated, the oxide layer 124 may be preferably removed by wet etching using an etching solution.

After removal of the oxide layer 124, the transparent conducting film 210 is formed on the group 4 element layer 133 so as to contact the group 4 element layer 133 exposed to the surface, and then the electrodes 310 and 320 may be preferably formed at the upper portion of the transparent conducting film 210 and the lower portion of the substrate, respectively.

FIG. 4 shows results obtained by secondary ion mass spectrometry (SIMS) sputter depth profiling of O, Si, and P, before and after annealing the composite stacked multiple layer manufactured in FIG. 3 at 1100° C. for 20 minutes, and FIG. 5 shows results obtained by secondary ion mass spectrometry (SIMS) sputter depth profiling of O, Si, and In, before and after annealing.

As shown in FIGS. 4 and 5, it could be confirmed that the deposited In is removed as complete as an amount thereof cannot be detected by the SIMS and P is maintained as it is by annealing.

Figure 6:
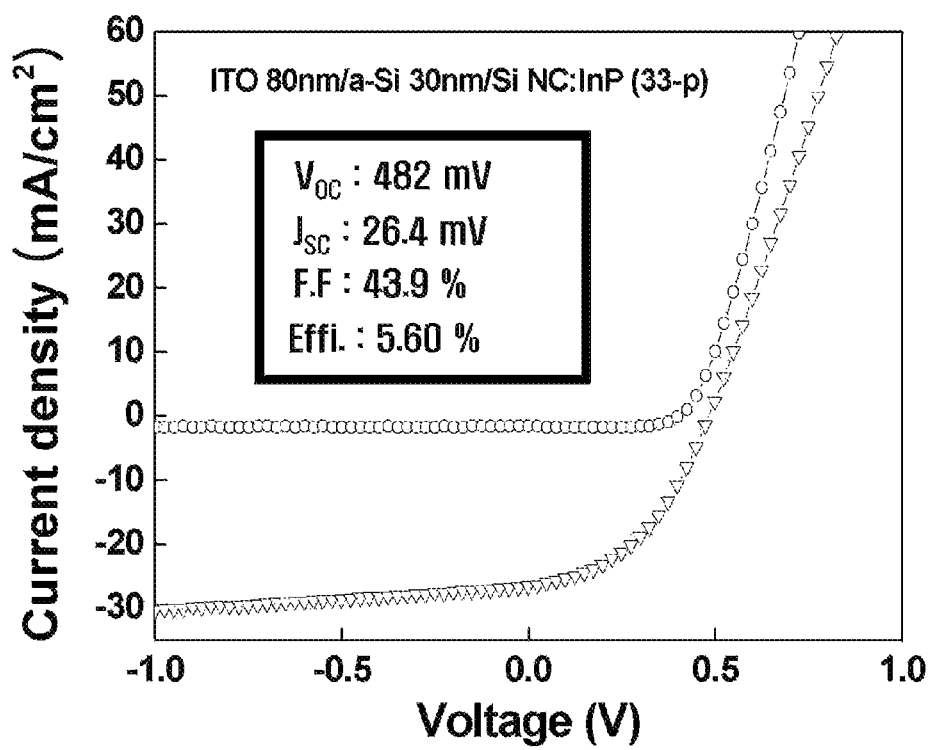
FIG. 6 shows results obtained by measuring efficiency of a quantum dot solar cell according to the present invention, wherein the quantum dot solar cell is manufactured by removing a surface oxide layer and then directly disposing an electrode on a polycrystalline silicon layer.
Figure 7:
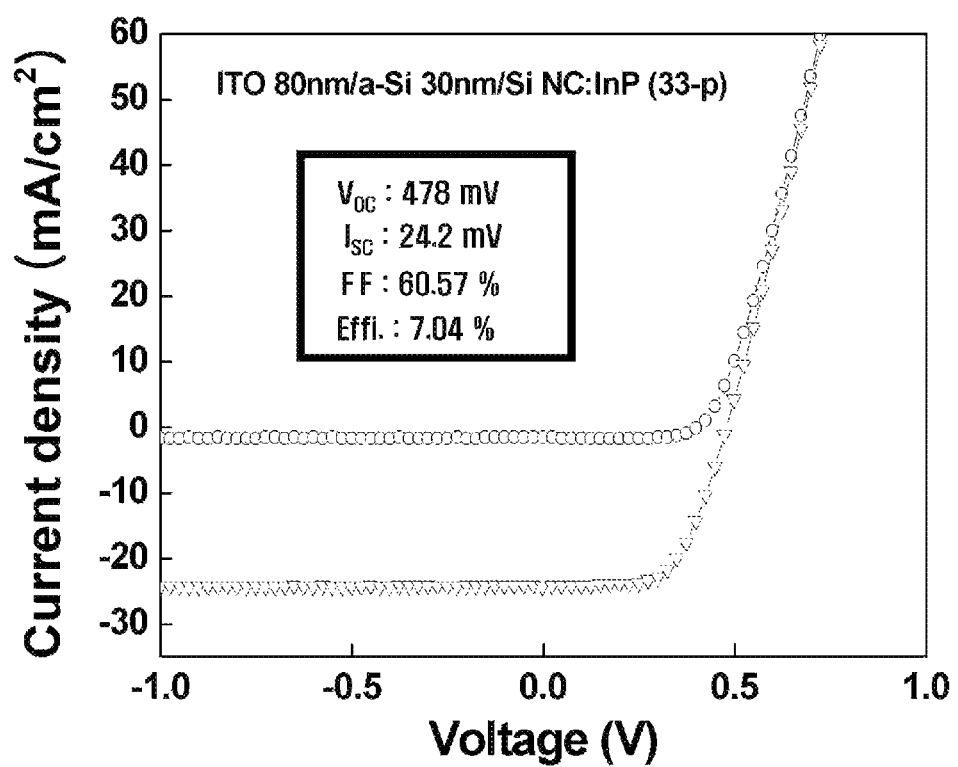
FIG. 7 shows results obtained by measuring photovoltaic efficiency of a quantum dot solar cell according to the present invention, wherein the solar cell is manufactured by removing a surface oxide layer and then forming an indium tin oxide (ITO) thin film having a thickness of 80 nm as a transparent conducting film.

FIG. 6 shows results obtained by measuring efficiency of a solar cell in which a surface oxide layer 134 is removed using a buffered oxide etch (BOE) solution from a quantum dot solar cell manufactured by repeatedly stacking an amorphous Si film doped with InP using a sputtering method as a semiconductor layer (1 nm) and a silicon oxide as a matrix layer (2 nm) 33 times to form a composite stacked multiple layer, forming an amorphous silicon layer (30 nm) doped with InP and a silicon oxide layer (20 nm), performing heat-treatment at 1100° C. for 20 minutes, and performing hydrogenation at 600° C. for 30 minutes, and then electrodes are directly disposed on a group 4 element layer 133. In addition, FIG. 7 shows results obtained by measuring photovoltaic efficiency of a solar cell device in which an indium tin oxide (ITO) thin film having a thickness of 80 nm as a transparent conducting film is used on the group 4 element layer 133 in a device similar to that in FIG. 6, and it could be confirmed that in the case in which the transparent conducting film is used, the efficiency is increased at a level of about 25%.

Hereinabove, although the present invention is described by specific matters, exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

The invention claimed is:

1. A manufacturing method of a semiconductor quantum dot-sensitized solar cell, the manufacturing method of a quantum dot solar cell comprising:
 a quantum dot forming step forming a semiconductor layer containing a group 4 element and InP as a dopant source on a substrate and then removing the indium (In) atoms from the semiconductor layer by post heat-treatment on the substrate, thereby forming an n-type semiconductor quantum dot, which is a group 4 element quantum dot doped with phosphorus (P).

2. The manufacturing method of a quantum dot solar cell of claim 1, wherein the semiconductor layer is made of a group 4 element or a compound of group 4 element with physically doped InP.

3. The manufacturing method of a quantum dot solar cell of claim 1, wherein the semiconductor layer includes an amorphous phase doped with InP.

4. The manufacturing method of a quantum dot solar cell of claim 1, wherein the semiconductor layer is a thin film of a group 4 element doped with InP, a nitride thin film of group 4 element doped with InP, an oxide thin film of group 4 element doped with InP, or a stacked multiple layer film thereof.

5. The manufacturing method of a quantum dot solar cell of claim 1, wherein the semiconductor layer containing the group 4 element and InP is formed by physical deposition method.

6. The manufacturing method of a quantum dot solar cell of claim 5, wherein the physical deposition method is a sputtering method, and the sputtering method is performed by simultaneous sputtering of a group 4 element target and a InP target with ion beams.

7. The manufacturing method of a quantum dot solar cell of claim 1, further comprising:
 a) a step of alternately stacking a matrix layer and the semiconductor layer on a p-type semiconductor substrate to form a composite stacked multiple layer;
 b) a step of performing heat-treatment on the composite stacked multiple layer to form a semiconductor quantum dots doped with phosphorus (P) in a matrix, which is semiconductor nitrides, semiconductor oxides, or a mixture thereof; and
 c) a step of performing heat-treatment under hydrogen atmosphere to bond non-bonded electrons of the semiconductor quantum dots doped with P to hydrogen.

8. The manufacturing method of a quantum dot solar cell of claim 7, wherein the semiconductor layer is a thin film of a group 4 element doped with InP, a nitride thin film of group 4 element doped with InP, an oxide thin film of group 4 element doped with InP, or a stacked multiple layer thereof, and the matrix layer is a nitride of group 4 element, an oxide of group 4 element, or a mixture thereof, independently of the semiconductor layer.

9. The manufacturing method of a quantum dot solar cell of claim 7, wherein thicknesses of the matrix layer and the semiconductor layer are 0.5 to 5 nm, independently.

10. The manufacturing method of a quantum dot solar cell of claim 1, wherein the heat treatment is performed at 900 to 1150° C.

11. The manufacturing method of a quantum dot solar cell of claim 1, wherein the group 4 element is at least one element selected from Si and Ge.

* * * * *